(12) United States Patent
Bartulos

(10) Patent No.: US 6,577,132 B2
(45) Date of Patent: Jun. 10, 2003

(54) PASSIVE SYSTEM FOR THE DETECTION AND INDICATION OF NON-IONIZING ELECTROMAGNETIC RADIATIONS AND STATIC ELECTRICITY

(76) Inventor: Jorge Raul Bartulos, Ayacucho 516, Buenos Aires (AR), 1026

( * ) Notice: Subject to any disclaimer, the term of this patent is extended or adjusted under 35 U.S.C. 154(b) by 0 days.

(21) Appl. No.: 10/005,478

(22) Filed: Nov. 12, 2001

(65) Prior Publication Data

US 2002/0101226 A1 Aug. 1, 2002

Related U.S. Application Data

(63) Continuation-in-part of application No. 08/896,201, filed on Jul. 17, 1997, now abandoned.

(30) Foreign Application Priority Data

Feb. 3, 1997 (AR) ...................................... P97 01 06403

(51) Int. Cl.⁷ ........................... G01R 31/00; G01R 1/30; H05F 3/00
(52) U.S. Cl. ....................... 324/404; 324/408; 324/115; 361/220
(58) Field of Search ................................. 324/404, 408, 324/409, 456, 501, 530, 627, 72, 115; 361/220, 212; 348/819; 313/479

(56) References Cited

U.S. PATENT DOCUMENTS

| | | | | | |
|---|---|---|---|---|---|
| 4,468,702 A | * | 8/1984 | Jandrell | ..................... | 174/35 R |
| 4,833,400 A | * | 5/1989 | Boutigny | ..................... | 324/115 |
| 5,256,960 A | * | 10/1993 | Novini | ..................... | 324/115 |
| 5,418,448 A | * | 5/1995 | Aslan | ..................... | 324/115 |
| 5,450,277 A | * | 9/1995 | Wescott et al. | ............. | 340/649 |
| 5,485,092 A | * | 1/1996 | Fortin | ..................... | 324/457 |
| 5,512,823 A | * | 4/1996 | Nepveu | ..................... | 324/115 |

* cited by examiner

Primary Examiner—N. Le
Assistant Examiner—Anjan K. Deb
(74) Attorney, Agent, or Firm—Darby & Darby

(57) ABSTRACT

A passive device for the detection and indication of non-ionizing electromagnetic radiations and static electricity is provided. The device is especially designed to be applied to or integrated in an anti-radiation/anti-static/anti-reflection filter intended to block the aforementioned emissions, particularly in devices with cathode ray tubes(CRT).

4 Claims, 8 Drawing Sheets

PASSIVE SYSTEM FOR THE DETECTION AND INDICATION OF NON-IONIZING ELECTROMAGNETIC RADIATIONS AND STATIC ELECTRICITY

CROSS-REFERENCE TO RELATED APPLICATION

This application is a continuation-in-part of U.S. patent application Ser. No. 08/896,201, filed Jul. 17, 1997 now abandoned, which is hereby incorporated by reference in its entirety.

BACKGROUND

Among the known viewing systems, devices with integrated cathode ray tubes hold the leading position. The most widespread applications thereof are concentrated primarily in large numbers in television sets and computer terminals.

The increasing use of these devices and the increased presence of humans in front of them has given rise, particularly in the last decade, to a lengthy list of medical ailments produced by exposure to the radiations emitted by these devices.

The most typical components of television sets and computer terminals are based on a cathode ray tube, transformers, deflection coils and high-voltage transformers which, in addition to their specific functions, are responsible for producing a combination of radiations, magnetic fields and accumulated static energies, which impact on and are definitely harmful to humans and their environment. Numerous investigations are continuously being carried out in order to identify and list the number of ailments harmful to human beings, which these radiations generate.

These emissions are present, and present levels of risk even for example in computer terminals or televisions sets designed with "low emission level" standards (such as those contained in the Swiss MPRII type monitor).

The influence of these radiations has, through years of study of their effect on the health of humans, given rise to what is known throughout the world as the "computer syndrome/PC syndrome/Tokomosho syndrome", which covers all the main ailments, which are known up to the present time and are generated by said radiations.

After many experiments directed at blocking these radiations, particularly for those most exposed to them within computer surroundings, special clothing made with a metal mesh, which is connected to a "ground discharge" has, for instance, been created. The main drawback of this clothing is that it is completely impractical and totally disregards the most sensitive organs of our organism, which are located in our head.

Another not very effective recommendation is to limit the use of computers, for example, to work surroundings, In Japan, regulations "prohibit" pregnant women from walking through surroundings in which computers are operating. In addition, to these problems, the need has arisen to block similar radiations in space, where there is no atmosphere to protect the health of astronauts.

Under these premises, various types of special optical lenses (normally tempered) have been created, on which additional coatings or multilayer surface treatments are deposited from a vapor in high-vacuum systems; the senses are provided with "metallic" coatings, which operated as a true "metallic mesh" in order to block said radiations.

Having noted the effectiveness of these systems and attempted in many cases to amortize the large investments made in order to develop them, many designers and/or manufacturers throughout the world have directed their efforts towards adapting these processes so as to provide protection against radiations and static electricity generated, in particular, by cathode ray tubes.

Other methods of blocking these radiations have also been implemented by applying adhesive films having conductive properties to windows, glass or screens in order to obtain similar protective effects. Other benefits generated by the inclusion of these treatments (by the interposing of these treated glasses between the cathode ray tube and the viewer) were the optimizing of viewing by increasing the contrast and eliminating the harmful reflections at the viewing surface.

A large number of glass factories, factories for manufacturing medical accessories, coating laboratories, product integrators, etc., through the world, noting the enormous potential market for the supplying this type of effective protection against radiation and static currents, emitted primarily) by computer terminals and television sets, directed their efforts effectively towards the design, integration, manufacture, marketing or distribution thereof.

Throughout the world, the so-called "anti-radiation/anti-static/anti-reflection filters" ("anti-glare/anti-radiation filters") were created, which rapidly spread throughout the world on the basis of the following brand names and manufacturers: ASSIST SYSTEM, AMERICAN COMPUTER OPTICS, ACCO, POLAROID, CHAMP, ERGOVIEW TECHNOLOGIES, CURTIS, NATIONAL POWER ELECTRIC, FELLOWES, KANTEK, KENSINGTON, MEDIAMATE, MEMOREX, NORAD, OPTIM-EYESER, SUNLIGHT BRAND, SUNFLEX, etc.

An analysis of the processes for optimizing viewing or the image is omitted, since these processes are not related to the main object of the present device. Only the process relating to the effect of non-ionizing radiations of very low frequency "VLF" (from 3 to 30 kHz) of extremely low frequency "ELF" (from 30 to 300 Hz) and of static electricity will be analyzed.

All the so-called "anti-radiation/anti-static/anti-reflection filters", have a component element in their design, which is absolutely indispensable for their normal operation, namely, the grounding cable or ground conductor.

This is the element which makes it possible to "discharge" (by "potential difference and low resistance") via the physical connection to a point considered the "reference ground", the radiation and the static electricity, trapped by the conductive mesh or covering of these anti-radiation/anti-static/anti-reflection filters and converted into an "electric current".

To obtain full electrical contact, the grounding cable is normally soldered or crimped to the metal contact, which is normally soldered or crimped to one of the sides of the glass/acrylic, etc., which is provided with the conductive membrane or film.

For practical purposes, the reference grounds suitable for the normal operation of these devices ideally are those, which are provided in computer centers, buildings with special ground installations in the form of buried stakes, household or commercial installations with ground-wire terminals (third contact) connected to metal water pipes, metal structures such as window or door frames, etc.

The anti-radiation/anti-static/anti-reflection filters are provided with terminals or fastening clamps, which make it possible to establish an effective discharge contact while maintaining a closed electric circuit of low resistance.

If the contact with the discharge point is deficient or should the discharge point have conditions of high resistance (far from what is presumed to be an "ideal earth/ground"), the efficiency of the blocking of the radiations and elimination of the static electricity will also be deficient.

If the discharge circuit is opened by disconnecting the ground/discharge cable or by breaking it, the effectiveness of these filters becomes almost zero in terms of blocking radiations and eliminating static electricity.

Due to the fact that these radiations and static electricity are absolutely invisible, but their harmful effects on humans is not, it was necessary to measure them with sophisticated and costly instruments, in order to convert them into visible and measurable parameters. These measurements, in particular, provided the possibility of determining the effectiveness of the anti-radiation/anti-static/anti-reflection filters and of exponentially increasing their commercial distribution primarily due to the fact that users who interacted with devices having an integrated cathode ray tube (and who have suffered and know about the harmful effects referred to herein) could not observe and determine on the basis thereof the risks of free exposure to these radiations and static electricity and their practically complete elimination (the interposition of some anti-radiation/anti-static/anti-reflection filters assures blockages of theoretical levels of effectiveness on the order of 99.99%).

The need to massively mobilize these expressive demonstrations of effectiveness in order to be able to open up markets by making potential users aware of the existence of these radiations and of harmful static electricity resulted in the appearance of portable measuring instruments, which made commercial and technical demonstrations of anti-radiation/anti-static/anti-reflection filters possible and showed the effectiveness of the filters to block radiations and static electricity to potential users at that time.

Devices of this type for the measuring radiations ("electric field scanner") are manufactured, for instance, by KROLMAN in Toronto, Canada under the name of Model R-900. These measuring devices have been adopted by most manufacturers and retailers of anti-radiation/anti-static/anti-reflection filters throughout the world at a present cost of approximately U.S. $45.00 (forty-five dollars) each.

By the placing of their internal or external sensor element (for this type of radiation) on the surface of the cathode ray tube and then on the surface of the anti-radiation/anti-static/anti-reflection surface, measurement systems of this type make it possible to show the presence or absence of harmful radiations and static electricity by an acoustic/visual display. Another useful demonstration and measurement carried out by the use of these external indicators/meters is to measure the emissions of the cathode ray tube with an interposed anti-radiation/anti-static/anti-reflection filter and to connect and disconnect successively the grounding cable or discharge element, thus verifying the successive appearances and disappearances of the radiations and of static electricity when said electric discharge path is connected and disconnected. The ability to visualize these radiations has become the key element in the distribution and sales support of the anti-radiation/anti-static/anti-reflection filters throughout the world for all their possible applications.

The impossibility of providing each anti-radiation/anti-static/anti-reflection filter with a portable radiation measuring device, such as those mentioned above (it must be borne in mind that the costs of filters of similar performance from different manufacturers throughout the world are averaged the price of a filter, which effectively blocks harmful radiations, is less than the cost of these measuring devices), gives rise to a large number of limitations and drawbacks, of which we will point out only the most obvious ones, in order to clearly show the benefits derived from the introduction of the claimed device. First, it is impossible to supply the potential user independently (without lending, demonstrating or selling an external radiation measuring device) with the ability to select the best alternative for the discharge connection for the optimum operation of this filter. Second, if changes are made in the electric connection or the physical location of the cathode ray tube device, there can be no assurance without a measurement instrument that the anti-radiation/anti-static/anti-reflection filter is blocking the radiations. Third, if the anti-radiation/anti-static/anti-reflection filter is relocated on another separate device not having a measurement instrument, there can be no certainty that the anti-radiation/anti-static/anti-reflection filter is blocking the radiations in this new system. Fourth, if the grounding conditions at the point of connection selected for the discharge of the radiations are changed, there can be no certainty that the anti-radiation/anti-static/anti-reflection filter is blocking the radiations. Fifth, for any promotion, demonstration and sale of these anti-radiation/anti-static/anti-reflection filters, it would be necessary to have external measuring elements, which make it possible to show their effectiveness and the best manner of installing or position them. Sixth, if the discharge circuit is damaged or even cut entirely in an undetectable manner (not visible, for instance when the discharge cable is cut internally, the solder connection or attachment of the end of the discharge cable to the conductive terminal of the filter is broken, the solder or attachment of the end of the discharge cable to the terminal/pin for connection to the external ground is broken, etc.), there would be no assurance that the anti-radiation/anti-static/anti-reflection filter is blocking the radiations. Seventh, the user of these anti-radiation/anti-static/anti-reflection filters could never have an agent integrated in his viewing region, which interactively and continuously indicates whether he is being protected from the harmful radiations emitted by the integrated device, in particular, by a cathode ray tube.

Eighth, serious difficulties and costly investments result from the impossibility of distributing the anti-radiation/anti-static/anti-reflection filters at places of mass sales, where the seller wishes to sell the products presented in "gondolas" ("supermarket" sales), primarily due to the fact that: (a) the potential buying/using public is unacquainted with the radiation blocking concepts, which these systems propose, since it cannot see or interpret them in any way; (b) the potential buying/using public is unable to differentiate between the quality of the different products available on the world market, some of which cannot even be considered as anti-reflection filters (because of their deplorable quality, they are expressly prohibited by optometrists) but which, due to their "relatively low cost" (actually it is very high since, in general, they effectively serve no purpose and normally guarantee services which, by their physical construction, they cannot provide, making them clear commercial swindles, which unfortunately are distributed and confuse the market) are presented to them, confusing them; (c) manufacturers, integrators, distributors and/or retailers in the world of anti-radiation/anti-static/anti-reflection filters must invest enormous amounts of money in order to train groups in sellers and promoters in stores, companies, supermarkets, etc., who equipped furthermore with radiation measuring devices or indicators, try to teach the operating principle and effectiveness of these devices to the potential buyers and users.

Despite the effort and investment made in it, the rate of return or effectiveness of such demonstrations is very low because the "potential" buyer/user is not certain that the effect demonstrated will function in the same manner at his home, work place, etc., primarily because of the inability to integrate an indicator element, which makes it possible to verify anywhere the effectiveness of the operation of this device, in the anti-radiation/anti-static/anti-reflection filter.

SUMMARY OF THE INVENTION

The present application discloses a new passive, integrated, continuously measuring and indicating element (fed with the energy itself, which it measures) of very low cost suitable for supporting large-scale developments) and can be integrated in or adapted or added to all the anti-radiation/anti-static/anti-reflection filters manufactured, integrated and/or sold throughout the world. More specifically, the present device is a passive device in that it measures the energy which is fed to the device itself through use of the discharging cable and the signal comparator and then acts to indicate the presence of non-ionizing electromagnetic radiation or static electricity based on the energy fed to the device. The device is thus passive because it is coupled to the discharge cable, which is a source of energy fed to the device, permitting the device to detect the variations in the energy (electric current) that is present or absent on the discharge cable. No external energy source is required to operate the device as it is configured to use the energy fed through the discharging cable as its energy source. In another embodiment, there is a coupling between the discharge cable and the device without using a comparator resulting in the device detecting the variations in the energy on the discharge cable. In each embodiment, the device operates with the energy received from the emissions conducted by the discharge cable.

Some devices are integrated primarily with cathode ray tubes (computer terminals, television sets, etc.), which have a technology similar to that of the anti-radiation/anti-static/anti-reflection filters that are manufactured, integrated and/or sold throughout the world or are integrated as a component part thereof. The present device is therefore presented so that this type of application, which in the coming years will possibly become a definite manufacturing trend, is also protected.

The present invention contemplates the nonlimiting use of active and passive circuits of different indicator elements (displays) and of mounting the operating system of this invention on the surface of the constituent glass/substrate of these filters. Furthermore, in particular, the integration of this invention in future or present imaging devices, which are formed, in particular (but not solely), with cathode ray tubes (CRT)", such as television sets/computer terminals, etc. and are combined with anti-radiation/anti-static/anti-reflection filters, is also protected by this patent. Within the protection stipulated and the claims made, particularly for these integrated designs, it is also contemplated to supplement the information supplied by the inventive nonlimiting detector circuit models to proprietary software (operative on the most widely distributed "operating system software"). This will make it possible to "visualize" on the screen of a computer terminal or the like the level of effectiveness/operation of the anti-radiation/anti-static/anti-reflection filter, which is included in this device.

Similarly, for television sets containing an anti-radiation/anti-static/anti-reflection filter, it is contemplated that, by integration with the inventive nonlimiting detector circuit models, an indication, which is "visualized" on the screen, is actuated by "panel commands" or by a "remote control". The level of effectiveness or operation of the filter contained in this device is thus determined.

The implementation of this passive system for the detection and indication of non-ionizing electromagnetic radiations and static electricity, especially designed to be applied to or integrated in any type of anti-radiation/anti-static/anti-reflection filter and intended to block said emissions particularly in devices with cathode-ray tubes (CRT), will make it possible to obtain enormous benefits, of which the following may be indicated by way of example:

(a) Incorporation and ease of integration on all models and designs through the world of anti-radiation/anti-static/anti-reflection filters of a system of interactive indication of their effective operation;

(b) This invention comprises an excellent new added value and/or distinguishing element for those world-wide manufacturers, integrators and/or resellers of anti-radiation/anti-static/anti-reflection filters, in which this invention is implemented;

(c) The possibility of eliminating the commercial costs and expenses of the distribution and of opening markets, due to the fact that as a result of having this invention implemented, the final user/buyer does not need to have a demonstration of the operation or of the special measurements "in situ", directed at determining the best manner of installation, connection or location of an anti-radiation/anti-static/anti-reflection filter, which is integrated by the present invention, since he himself can determine whether the filter is operating correctly because of the indication provided by the design proposed here;

(d) Factories, integrators, distributors, resellers, etc., throughout the world of anti-radiation/anti-static/anti-reflection filters will eliminate the risk of international lawsuits by users who, in view of the present impossibility of continuously monitoring the state of connection and operation of their filter, claim bodily injury because of the lack of protection of themselves or because of having been over-exposed to the effects of these radiations, while believing that they were protected by their filter but without being able to verify this.

BRIEF DESCRIPTION OF THE DRAWINGS

The foregoing and other features of the present invention will be more readily apparent from the following detailed description and drawings of illustrative embodiments of the invention in which.

DETAILED DESCRIPTION OF THE PREFERRED EMBODIMENTS

Figure 1:
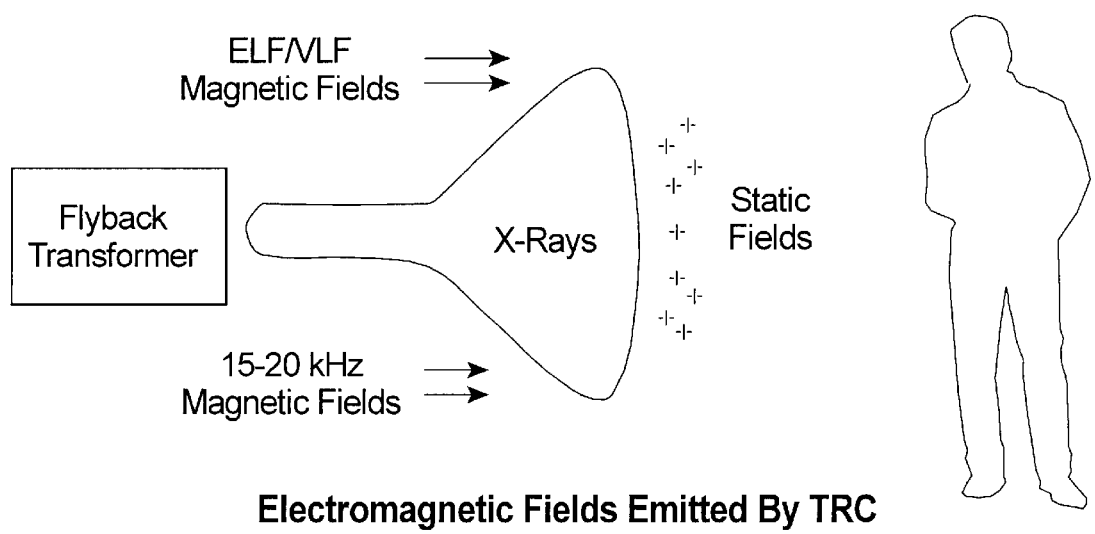
FIG. 1 diagrammatically illustrates the presence of non-ionizing radiations of several types in the vicinity of a cathode ray tube and the influence of these radiations on people.

Referring first to FIG. 1 which shows the presence of non-ionizing radiations of very low frequency "VLF" ("Very Low Frequency" from 3 to 30 kHz), those of extremely low frequency "ELF" ("Extremely Low Frequency" < from 30 to 300 Hz) and static electricity, in the vicinity of a cathode ray tube and the influence of these radiations on people that are in the surrounding location of the cathode ray tube or the like.

Figure 2:
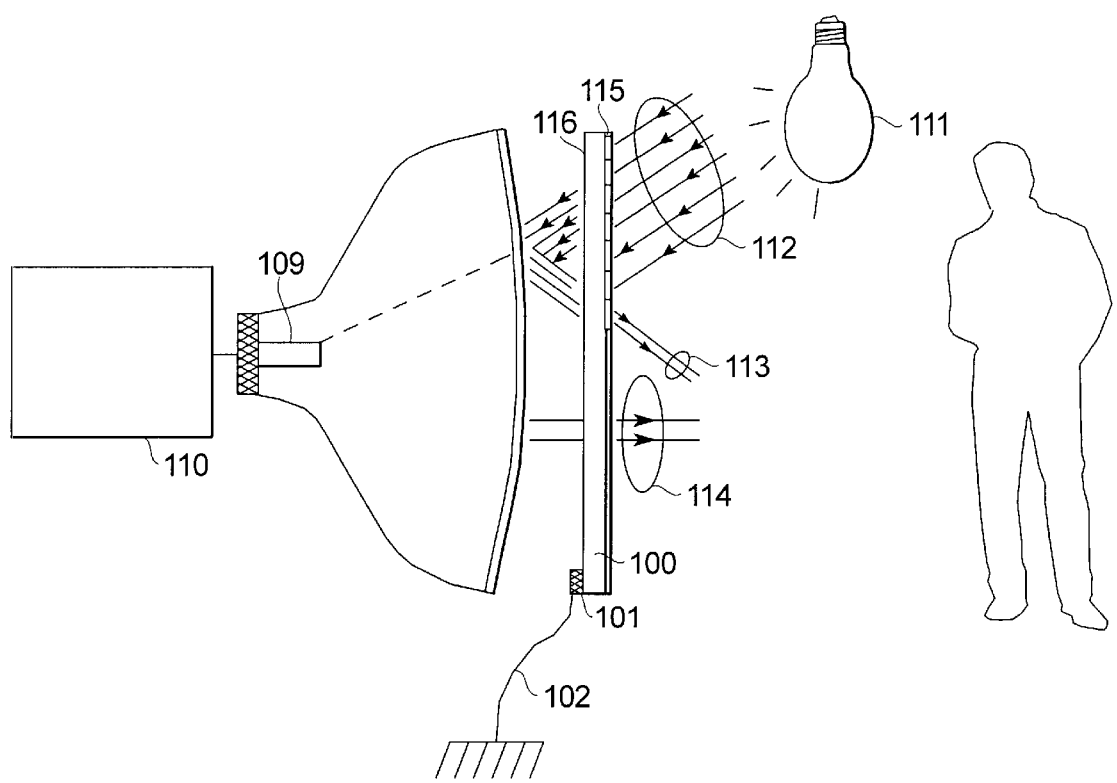
FIG. 2 diagrammatically illustrates an apparatus that is responsible for the harmful emissions as well as a passive device according to an exemplary embodiment for the detection and indication of non-ionizing electromagnetic radiations and static electricity.

FIG. 2 diagrammatically shows an apparatus and its basic components responsible for the harmful emissions described, as well as the undesirable effects of light on people. In the FIG. 2, the block 110 represents the combination of the most typical components of television sets and computer terminals, namely transformers, deflection coils and high-voltage transformers. These components 110 are attached to a cathode ray tube 109. The components 110 and cathode ray tube 109 in addition to performing their specific functions, they are also responsible for generating radiations, magnetic fields and accumulated static energies, which impact on and are definitely harmful to people and the environment.

A glass/screen/substrate 100 is constituted by the physical support for the "coating" or for the different treatments, which convert it into an anti-radiation/anti-static/anti-reflection filter. A coating or coatings 115 provide the anti-reflection function of the filter, so that, when the beams of light 112 coming from a source of light 111, impinge on it or them, they are reflected in attenuated fashion as beams of light 113. Metallic/conductive coating or coatings 116 primarily provide the anti-radiation/anti-static function of the filter because when emissions/radiations, emitted basically by the beams of light 112 coming from the source of light 111, strike the coating or coatings, they are reflected in an attenuated manner as the beams of light 113.

There may also exist in these anti-radiation/anti-static/anti-reflection filters functions of attenuation of the intensity of given luminous radiations, thus emitting beams of processed light 114 and then operating as a light "bandpass filter". A discharge cable or mechanism 102, once connected to an electric contact 101 of the conductive film/coating/mesh, performs the primary function of conducting the captured energy to the ground 103.

Figure 3:
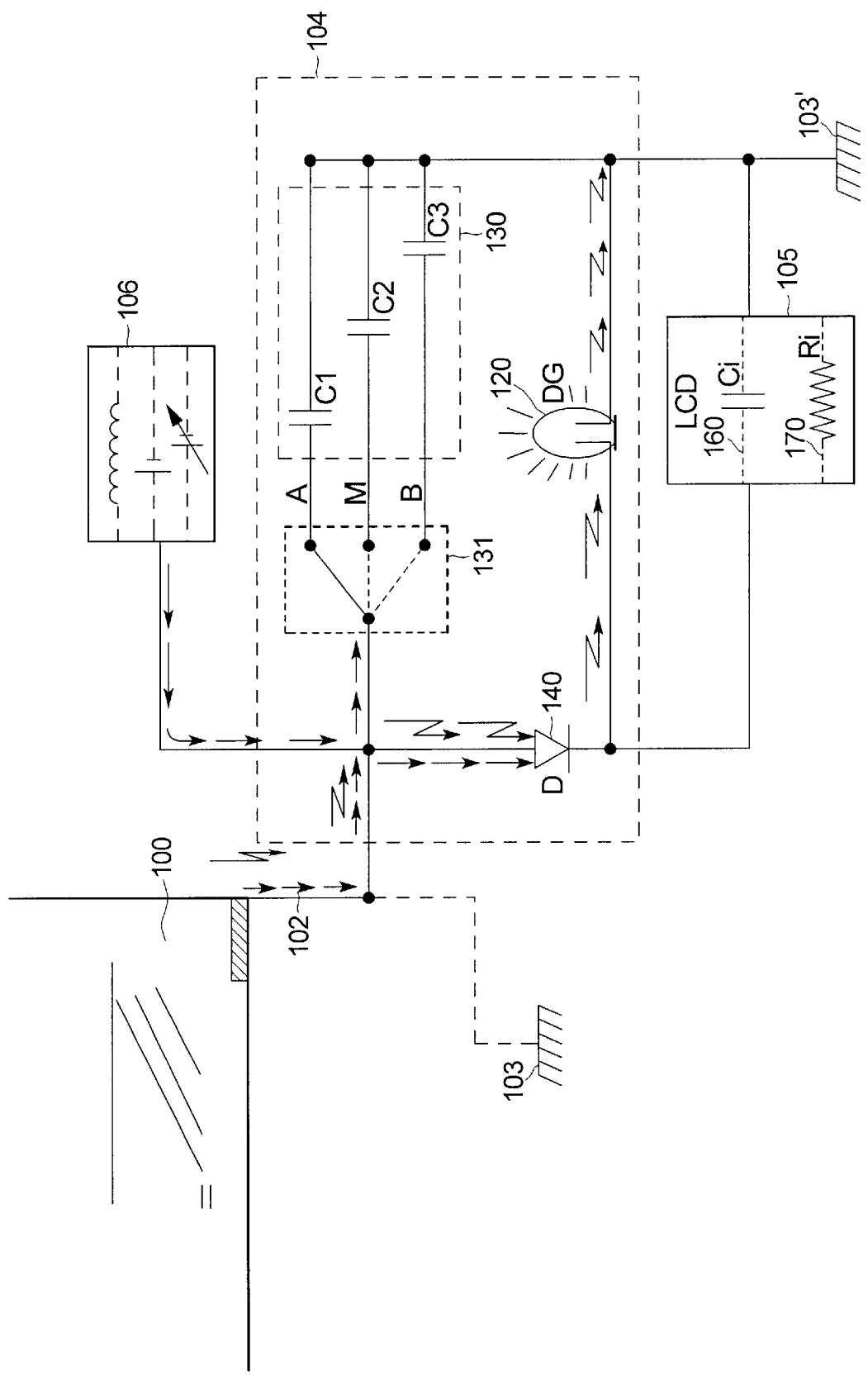
FIG. 3 is a schematic block diagram illustrating a passive device for the detection and indication of non-ionizing electromagnetic radiations and static electricity according to a first embodiment.
Figure 4:
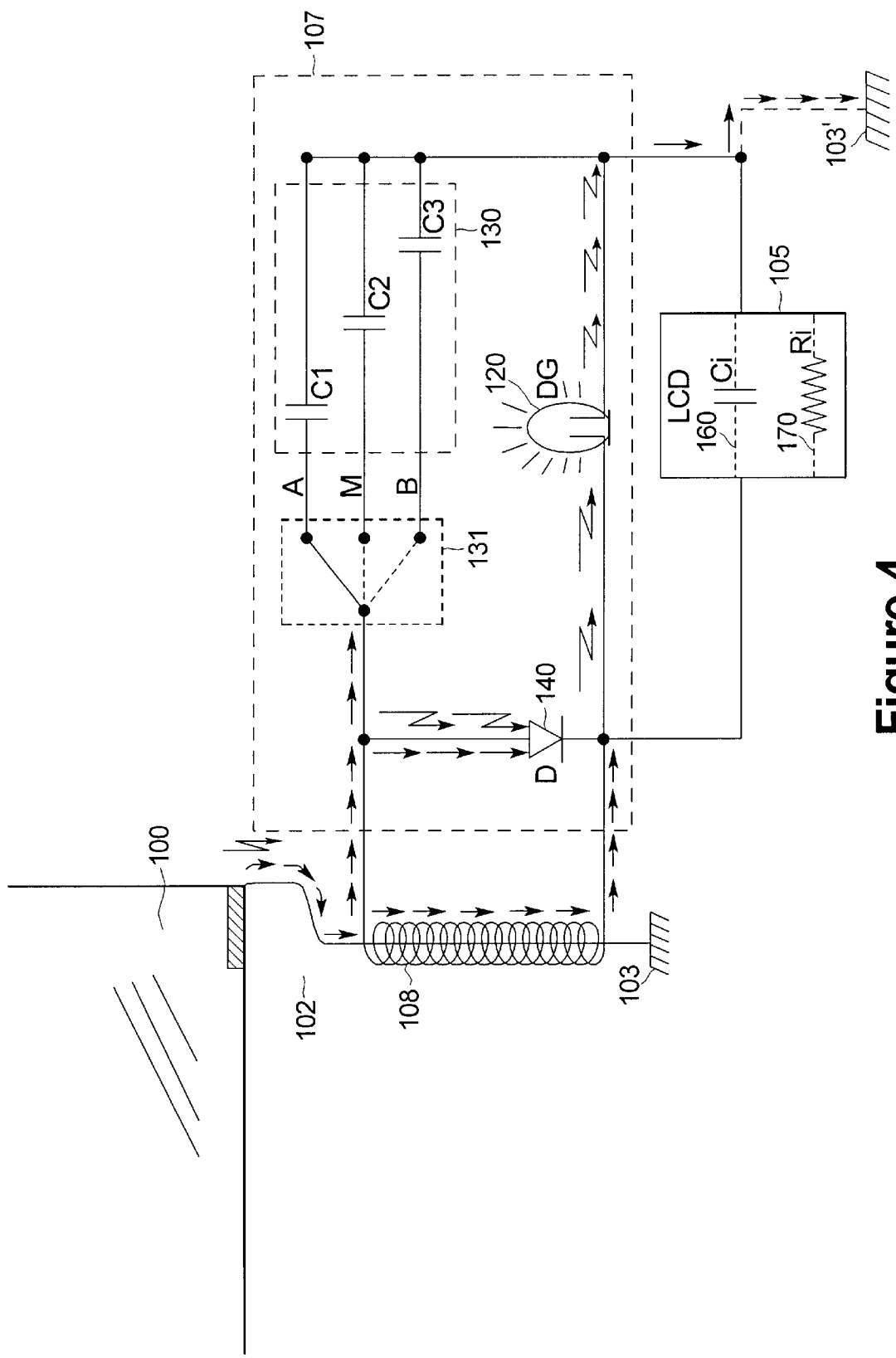
FIG. 4 is a schematic block diagram illustrating a passive device for the detection and indication of non-ionizing electromagnetic radiations and static electricity according to a second embodiment.
Figure 5:
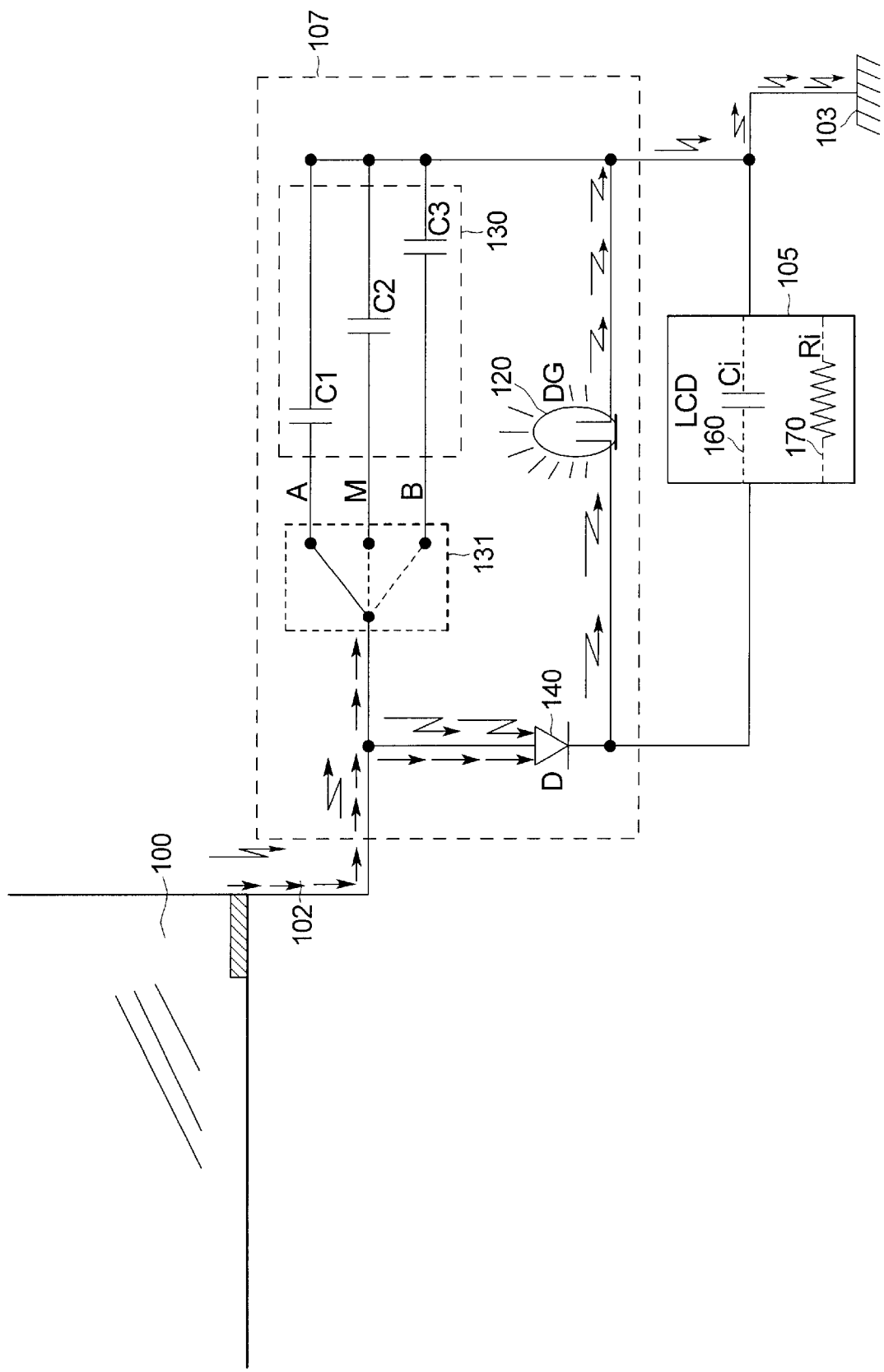
FIG. 5 is a schematic block diagram illustrating a passive device for the detection and indication of non-ionizing electromagnetic radiations and static electricity according to a third embodiment.
Figure 6A:
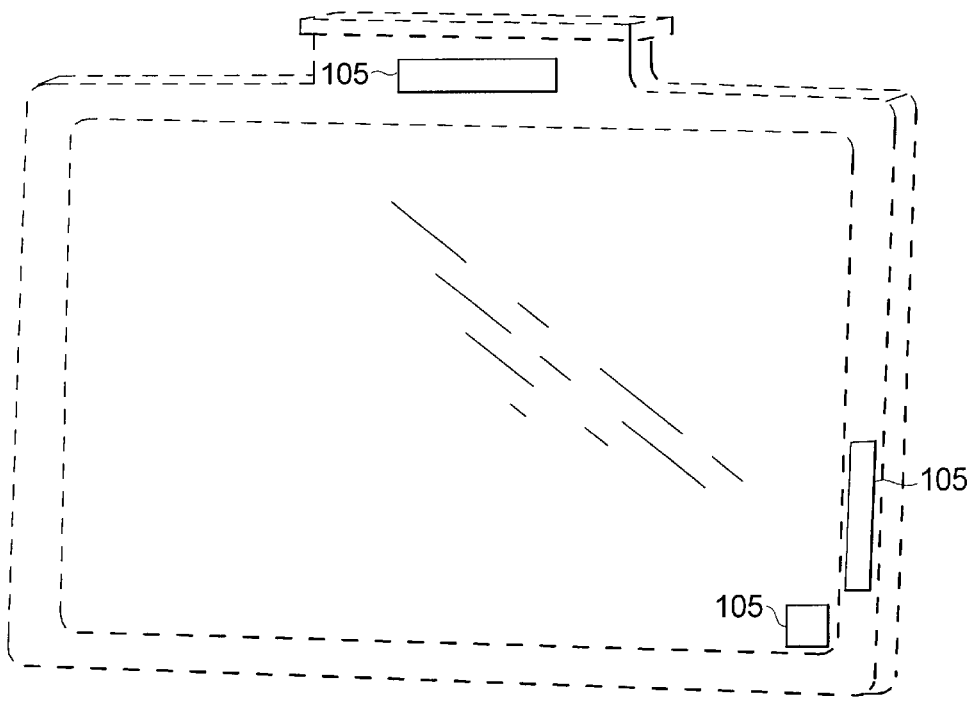
FIGS. 6A, 6B, 6C, 6D are schematic diagrams illustrating potential areas of mounting any of the devices of the different embodiments.
Figure 6B:
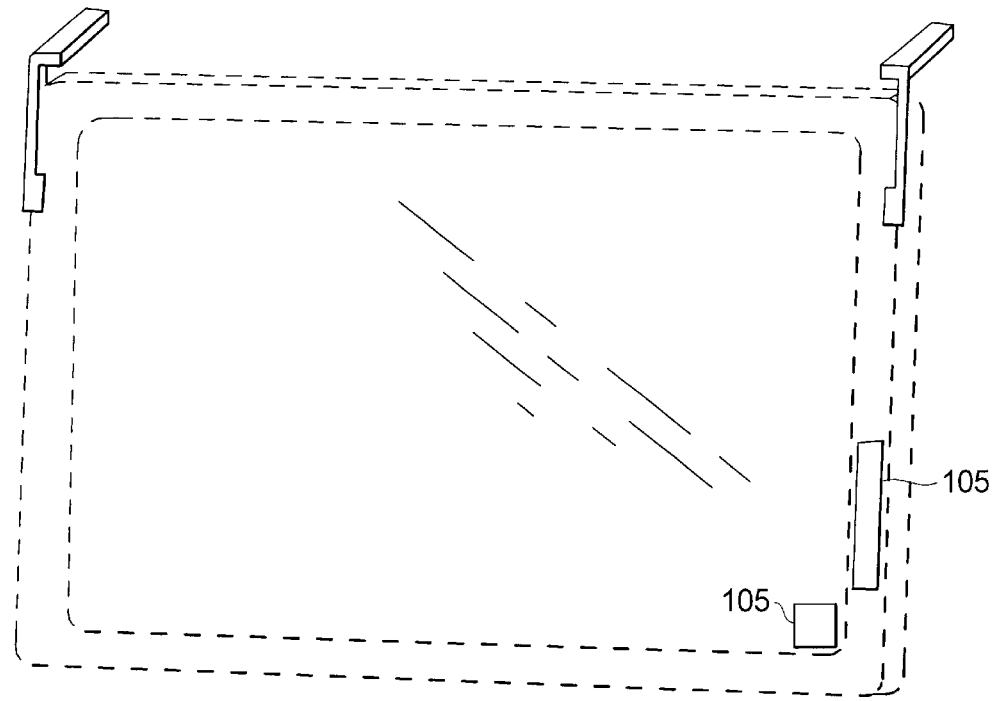
Figure 6C:
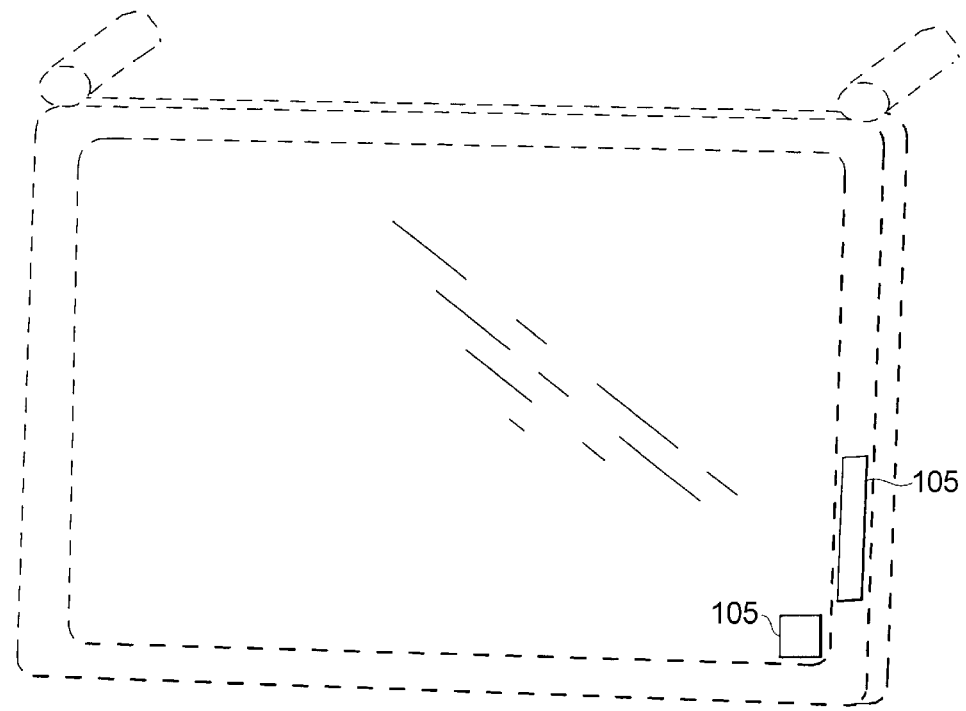
Figure 6D:
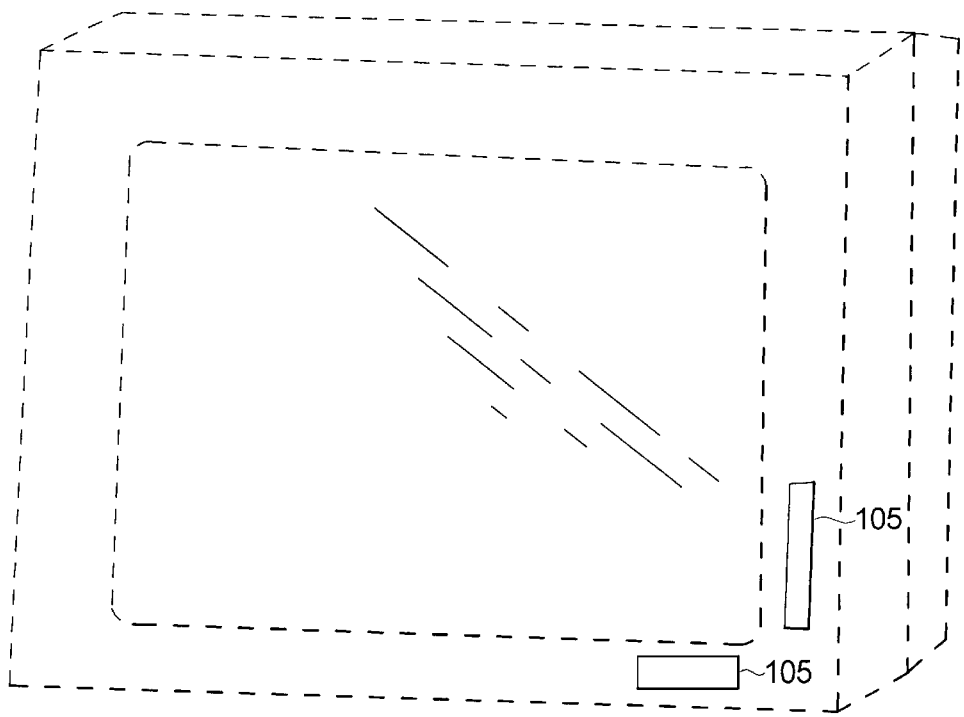

FIGS. 3 through 5 are block diagrams, which show the principles of operation involved in the devices of the present application and the implementation of these devices on the conductive film, coating/mesh supported on the filters. In these Figures, the same reference numerals indicate identical or corresponding parts. As is clearly evident from FIGS. 3 through 5, the present device, in each embodiment, is a passive device for the detection and indication of non-ionizing electromagnetic radiations and static electricity, especially designed to be applied to or integrated in any type of anti-radiation/anti-static/anti-reflection filter for blocking said emissions, particularly in devices with cathode-ray tubes (ORT). With respect to the embodiments of FIG. 3, the devices comprises, in particular, a detector circuit 104, a reference level circuit 106, a conductor for connection to the discharge point of the filter 102 and an indicating system 105. The detector circuit 104 will be described in greater detail hereinafter.

In the alternative embodiments illustrated in FIGS. 4 and 5, the detector circuit 104 is replaced by alternative circuit configurations. In FIGS. 4 and 5, the reference numeral 107 represents an inductive detector circuit and the reference numeral 108 represents an inductive sensor. FIG. 5 shows a nonlimiting alternative circuit, based on a device formed by resistive, capacitive and/or inductive components 107, in which, differing from the application shown in FIG. 4, the extensions 108 serve to insert the detector circuit 107 between the conductor 102 connected to the discharge point of the filter and the ground 103.

FIG. 5 shows a nonlimiting alternative circuit based on a device formed by resistive, capacitive and/or inductive components 107, in which, differing from the application shown in FIG. 4, the extensions 108 serve to insert the detector circuit 107 between the connecting conductor to the discharge point of the filter 102 and the ground 103.

In accordance with the embodiment shown in FIG. 3, the discharge conductor 102 is a multi-wire cable (no less than eight wires), capable of conducting the electric current with minimum resistance. The conductor, which may even be part of the cable normally used in the construction of this type of filter or simply the connection to the detector circuit 104, can be established by baring the protective plastic mesh of the conductor 102, and placing it in contact with this detector circuit 104.

Furthermore, the reference level circuit 106 is another passive device of primarily an inductive character which, installed on the surface of the filter, is capable of establishing a reference voltage level in order to supply it to the detector circuit 104, with reference to the states of presence and absence of the group of radiations, magnetic fields and accumulated static energies, which impact in first instance (once installed) on the coatings/surface treatments/conductive membranes, etc. of the anti-radiation/anti-static/anti-reflection filters. Thereupon, the indicator system 105 is formed of a liquid quartz indicator panel of extremely low consumption which, at the option of the manufacturer and of the final design, may offer different types of visual indications, which changes its states of indication with respect to the variations coming from the detector circuit 104.

FIGS. 3 through 5 all illustrate in detail the detector circuits 104, 107 and the inside of the reference level circuit 106. Each of the detector circuits 104, 107 is connected to the ground 103 (ground 103, 103' in the case of the embodiment of FIG. 3) and with each of the detector circuits 104, 107 containing a gaseous discharger (DG) 120, a set of capacitances (capacitors), generally indicated at 130, and a diode 140. The gaseous detector 120 is responsible for detecting and handling the discharge currents (ESD). The ESD currents are peaks of currents that last briefly enough to ionize the discharger 120, whose main function is to protect the set of capacitances 130 and send such ionizing radiation to the display 105. The set of capacitances 130 (indicated by C1 to C3) sets the circuit to detect and handle the currents originated by high, medium or low radiation (represented as A, B, C, respectively) depending on the quality of the metallic coating of the CRT.

The set of capacitances 130 can be manually selected by means of a selector key, depending on the type of the incoming non-ionizing radiation. In each of FIGS. 3 through 5, a switch is generally indicated at 131 for making a selection of one of the set of capacitances. The set of capacitances 130 is also tuned and integrated with the capacitance (Ci) 160 and the resistance (Ri) 170 of the display 105. It will be appreciated that the capacitances 130 can also be carried out automatically instead of manually. Furthermore, the currents can be drained to ground 103, 103' in FIG. 3 and ground 103 in FIG. 4 after passing also through the display 105 which is connected in parallel to the gaseous discharger DG 120 and through the discharge cable 102 to ground 103.

Due to the fact that the display 105, is also tuned with the set of capacitances C1 to C3, which are capable of handling low, medium or high currents, the detector circuits 104, 107 are capable of detecting, intelligently and continuously, currents that are originated by non-ionizing radiations (VLF/ELF) and electrostatic discharges (ESD). In the former case, the currents are handled by the set of capacitances C1 to C3 and in the later case, the current goes through the gaseous detector 120 which is ionized, thereby protecting the set of capacitances from being damaged. The display 105 is made based on the design of the circuits 104, 107. As no external active elements feed the display 105 but the currents collected from the screen by means of the discharge cable 102, such consumption must be low. At the same time, the display 105 is configured to indicate whether the current is being drained through the set of capacitors 130 or through the gaseous detector DG 120. Based of the aforementioned, the conductive condition of the screen 100 can be verified and further controlled.

In the case of FIG. 5, which is one preferred embodiment, there is only one ground 103 as the circuit is interposed between the ground 103 and the discharge cable 102. The exemplary reference level circuit 106, which can or can not be in the circuit of reference, is in charge of generating an additional energy level to lit the display 105 by means of an inductor, a solar panel, or a battery when the current that circulates in the circuit is not enough to do so. The reference level circuit 106 illustrated in FIG. 3, which is connected to the comparator 104, can also be used in alternative devices in which the reference level circuit 106 is then connected to comparator 107. The reference level circuit 106 can include a coil, battery, or a solar panel depending upon on the technician. The battery is an active device, but the coil can capture the radiation coming from the CRT (cathode-ray tube) when the same is not properly isolated (passive). The solar panel utilizes light radiation from any source that provides it.

The function of the diode 140 is to increase the signal level on the display 105 and to avoid, at the same time, any current reflux.

According to the various embodiments, the circuit of FIG. 3 is considered reactive, the circuit of FIG. 4 is considered inductive, and the circuit of FIG. 5 is considered capacitive. However, these conditions coexist in all of the circuits embodiments. Therefore, it the currents are originated by ESD, the currents go through the gaseous detector 120 which is ionized, thereby protecting the set of capacitances from being damaged.

In the case of currents that are originated by non-ionizing radiations (ELF/VLF), these currents go through the set of capacitances 130 which must be set for (manually or automatically) for high, medium or low currents. The set of capacitances 130 for each of the detector circuits 104, 107 contains capacitance C1 associated with the high radiation, a capacitance C2 associated with a medium radiation, and a capacitance C3 associated with a low radiation. As previously-mentioned, the set of capacitances 130 must be set manually or automatically for the high, medium and low radiations (i.e., currents). For example, the set of capacitances 130 may be set by a switch or the like which allows a user to easily set and later adjust the operational level of the devices at installation time or a later time. Accordingly, the present circuits illustrated in FIGS. 3 through 5 behave in the foregoing manner in which they detect, alert, and drain to ground, continuously and intelligently, harmful currents for a human being.

One of the advantages of the circuits of FIGS. 3 through 5 is that they are passive, as previously-discussed and furthermore, the reference level circuit 106 is adapted to handle at the same time intelligently and continuously both types of currents without any risk of damaging the electrical components due the presence of the gaseous discharger 120. This is a significant difference and advantage over the previously-described conventional devices that are available. More specifically, the conventional devices do not contain circuits that are configured to measure passively, at the same time and continuously, electrostatic discharges (ESD) and non-ionizing radiation emerging from CRTs.

With respect to the embodiment of FIG. 3, the indicator 105 will not indicate anything when all the current drains through the cable 102 and the ground 103. This is true when the ground is properly connected, but when it is not, part of the current that electrostatic discharges or non-ionizing electromagnetic fields generate will, in fact, go through the detector circuit 104 and the indicator 105 will light up. In that occasion, the circuit of reference 106 will indicate that the ground is not properly connected by showing an icon in the display 105, thereby indicating that the ground should be fixed. If the ground is not properly fixed, the display will continue indicating that the operator is constantly being affected by emissions that would have had to be handled by the cable 102 and drained to ground 103.

Furthermore, in accordance with the embodiments shown in FIG. 4 and FIG. 5, the inductive sensor cable 108 embraces or is in contact with the discharge conductor 102, which is capable of acting as a sensor of the presence or absence of the electric currents generated by the group of radiations, magnetic fields and accumulated static energies, which impact in the first instance (once installed) on the coatings/surface treatments/conductive membranes, etc. of the anti-radiation/anti-static/anti-reflection filters, supplying different states of voltage to the inductive detector circuit 107.

Thus, the inductive detector circuit 107 is a passive unit formed in particular by resistive/inductive devices of low consumption, which are capable of interpreting the minimum differences in potential present delivered by the inductive sensor cable 108 and cause a specific voltage output indication for each state resulting from this interpretation to the indicator system 105.

In the same way, the indicator system 105 consists of a liquid quartz indicator panel of very low consumption which, at the option of the manufacturer and of the final design, may offer different types of visual indications, which change their states of indication with respect to the changes coming from the inductive detector circuit 107.

These nonlimiting designs for the functions and applications described in this invention contemplate the implementation of these systems but with the provision of additional electric energy (internal by batteries, external, solar, etc.). Accordingly, the non-limiting configuration can operate both with passive circuits and with active circuits.

On the other hand, the components, which are a constituent part of this patent, are also intended to be integrated with techniques available on the world market of "surface mounting", so that the "passive system for the detection and indication of non-ionizing electromagnetic radiations and static electricity, especially designed to be applied to or integrated in any type of anti-radiation/anti-static/anti-reflection filter and intended to block said emissions, particularly in devices with cathode-ray tubes (CRT)", is mounted with these principles on the anti-radiation/anti-static/anti-reflection filters manufactured, integrated and/or developed, etc. throughout the world.

Finally, other devices, which contemplate processes for filtering emissions in bands different from the non-ionizing radiations of very low frequency "VLF" ("Very Lowe Frequency" from 3 to 30 kHz) and extremely low frequency "ELF" ("Extremely Low Frequency" from 30 to 300 Hz) and static electricity and normally generate electric discharge currents applicable for generating an indication as described above, also fall within the scope of the invention.

In nonlimiting form, FIGS. 6A through 6D show the possible areas for mounting and integrating the final product of this invention on some of the most typical formats distributed on the world market of anti-radiation/anti-static/anti-reflection filter.

Figure 7:
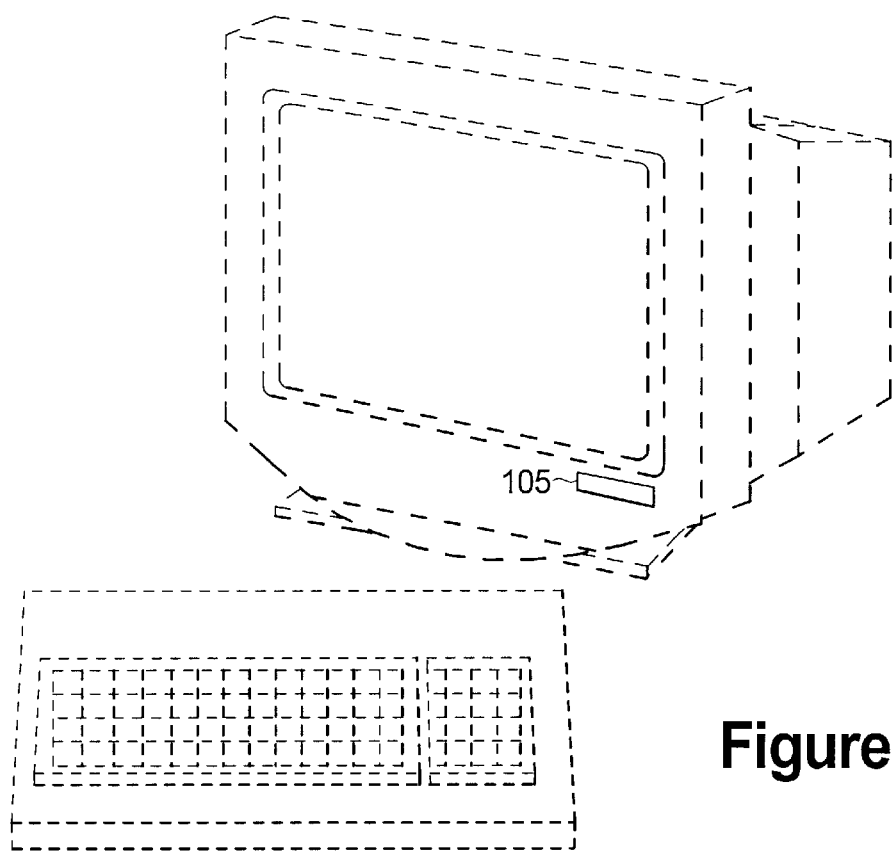
FIGS. 7 and 8 illustrate further areas for mounting and integrating the devices of the present application into various apparatuses.
Figure 8:
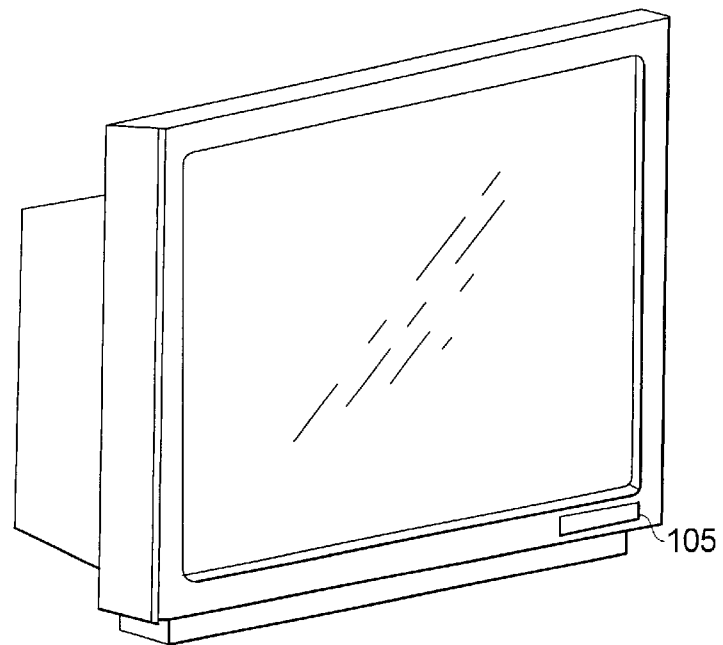

Furthermore, FIGS. 7 and 8 indicate, in nonlimiting form, the possible areas of mounting and integrating the final product of this invention on some of the more typical formats, which are distributed throughout the world market of computer terminals and television sets and are integrated with anti-radiation/anti-static/anti-reflection filter, respectively.

Operation

The non-ionizing radiations of very low frequency "VLF" and those of extremely low frequency "ELF" and static electricity impinging on the conductive surface 116 of an anti-radiation/anti-static/anti-reflection filter, arranged in a form parallel to the emitting device (systems formed primarily with cathode ray tube, 109/110 FIG. 2), generate on the discharge conductor 102 an electric current whenever the end of the conductor 102 is connected to a ground 103; this makes it possible then to establish a difference in potential.

The conductive surface 116 behaves as a true "metallic shield" for this level of radiations and operates with greater effectiveness if the reference ground is ideal (zero resistance) and therefore a greater potential difference is established.

This potential difference makes it possible to "drain" the non-ionizing radiations of very low frequency "VLF" and those of extremely low frequency "ELF" and the static electricity, which impacts on the conductive surface 116, the radiations and static electricity being converted into an electric current, which flows through the discharge cable 102.

It is important to point out that, when there is no connection between the discharge cable 102 and a discharge point (ground 103), measurable electric currents are not recorded on it.

In other words, when the ground situation is ideal with levels of resistance close to zero and the level of emission of radiations is the same, the electric current detectable on the conductor 102 will assume a maximum level.

In this way, it is possible to distinguish between two states of energy on the conductor 102, a maximum state and a minimum state (or absence of the recording of any detection).

Since the elements, which can be used as ground 103, differ and in all cases are far from ideal, the circuits designed for the nonlimiting models, described in FIGS. 3 and 4, also take these limitations into consideration and facilitate the creation of indications provided across 105 with preestablished margins, which enable the user to know whether he is protected by his anti-radiation/anti-static/anti-reflection filter, and to identify fluctuations or imperceptible margins of variation, which may be present around the conditions of the ground 103, in particular, for the inventive nonlimiting passive designs (without external feed).

The detector circuit 104 detects the variations, which occur on the conductor 102 when the latter conducts or does not conduct a measurable level of energy due to the good or poor condition of the ground 103.

Furthermore, the reference level circuit 106 provides the detector circuit 104 with another state of detection, which enables the latter to generate a display on the indicator 105 with respect to the states of presence and absence of the group of radiations, magnetic fields and accumulated static energies, which impact in the first instance (once installed) on the coatings/surface treatments/conductive membranes 116 of the anti-radiation/anti-static/anti-reflection filters. In other words, the key feature of the system is that it is independent of the detection or measurement of the group of radiations, magnetic fields and accumulated static energies, which impact in the first instance (once installed) on the conductive coatings/surface treatments/membranes 116 of the anti-radiation/anti-static/anti-reflection filters in order to be concentrated on the effective detection and interpretation of the "electric currents" established on the discharge conductors (102) of these filters.

This is to say that the design criterion of this invention is based on a process of indirect indication since, when the indicator 105 indicates that the filter is "effectively blocking" the group of radiations, magnetic fields and accumulated static energies, what is actually being recorded and detected is a "good condition of ground 103", which guarantees the circulation of the "electric current", into which these radiations/emissions have been converted after being picked up by the conductive coatings/surface treatments/membranes 116 of the anti-radiation/anti-static/anti-reflection filters, which are designed, manufactured and/or integrated throughout the world.

For the circuits designed for the nonlimiting model described in FIG. 4, the sole operating difference is based on the use of an inductive sensor 108 which, in association with an inductive detector circuit 107, detects the "variations in the electric current" established on the conductor 102 and, form this, generate a reference voltage, which activates the display of the indicator 105.

This last nonlimiting embodiment of the invention is intended to be used primarily on systems with levels of radiation, magnetic fields and accumulated static energies, which are much greater than those dealt with this invention (outside of the Standards set forth in the Swiss MPRII, for instance).

Advantageously, the circuits of the various embodiments shown in FIGS. 3 through 5 can process, indicate, and drain to ground, continuously, intelligently and independently, every radiation (VLF, ELF) or discharge current (ESD) to alert, prevent or protect a human being from being exposed to the same.

While the invention has been particularly shown and described with reference to preferred embodiments thereof, it will be understood by those skilled in the art that various changes in form and details may be made therein without departing from the spirit and scope of the invention.

What is claimed is:

1. A passive apparatus for the detection and indication of non-ionizing electromagnetic radiations and static electricity and adapted to be applied to or integrated in an anti-radiation/anti-static/anti-reflection emission blocking filter, the apparatus comprising:
   a discharge cable connected to an electric contact of the filter;
   a detector circuit having an input, the electric contact being connected to said input by the discharge cable; the detector circuit comprising:
      a diode having a first end and a second end; the diode having its first end connected to said input,
      a switch connected to said input;
      a detecting device connected in series to the diode at the second end of the diode; and
      a plurality of capacitors coupled in series to the switch; and
      a low consumption indicator tuned with said plurality of capacitors for indicating the presence of at least one non-ionizing electromagnectic radiation and static electricity connected at one end to the second end of the diode;
   wherein one end of each of the detecting device, the indicator and the plurality of capacitors is connected together to ground and are connected in parallel with each other wherein the detecting circuit and indicator is driven by the current in the discharge cable without requiring an external power source.

2. The apparatus of claim 1, wherein the plurality of capacitors includes a first capacitor for detecting high current levels, a second capacitor for detecting medium current levels; and a third capacitor for detecting low current levels, being such currents originated by non-ionizing radiation (ELF/VLF).

3. The apparatus of claim 1, wherein the detecting device comprises a gaseous detector that detects and discharges static electricity.

4. The apparatus of claim 1, wherein the switch is one of a manual switch and an automated switch for setting the switch to one of the plurality of capacitors.

* * * * *